United States Patent
Shibano et al.

(10) Patent No.: US 9,465,267 B2
(45) Date of Patent: Oct. 11, 2016

(54) DISPLAY DEVICE

(71) Applicant: KYOCERA Corporation, Kyoto-shi, Kyoto (JP)

(72) Inventors: Minoru Shibano, Kyoto (JP); Ryoichi Yokoyama, Kyoto (JP)

(73) Assignee: Kyocera Corporation, Kyoto (JP)

(*) Notice: Subject to any disclaimer, the term of this patent is extended or adjusted under 35 U.S.C. 154(b) by 327 days.

(21) Appl. No.: 14/348,166

(22) PCT Filed: Sep. 27, 2012

(86) PCT No.: PCT/JP2012/074891
§ 371 (c)(1),
(2) Date: Mar. 28, 2014

(87) PCT Pub. No.: WO2013/047661
PCT Pub. Date: Apr. 4, 2013

(65) Prior Publication Data
US 2015/0049449 A1 Feb. 19, 2015

(30) Foreign Application Priority Data
Sep. 30, 2011 (JP) ................. 2011-215920

(51) Int. Cl.
*G02F 1/1345* (2006.01)
*H05K 1/09* (2006.01)
(Continued)

(52) U.S. Cl.
CPC ............ *G02F 1/13458* (2013.01); *H05K 1/09* (2013.01); *H05K 1/111* (2013.01); *G02F 1/1345* (2013.01);
(Continued)

(58) Field of Classification Search
CPC .................................................. G02F 1/13458
See application file for complete search history.

(56) References Cited

U.S. PATENT DOCUMENTS

| | | |
|---|---|---|
| 2008/0180627 A1 | 7/2008 | Yasuda et al. |
| 2009/0026462 A1 | 1/2009 | Hashiguchi |
| 2010/0321624 A1 | 12/2010 | Yanagisawa |
| 2011/0205716 A1* | 8/2011 | Moriwaki .............. H05K 1/025 361/748 |

FOREIGN PATENT DOCUMENTS

| | | |
|---|---|---|
| JP | 2005115129 A | 4/2005 |
| JP | 2008028145 A | 2/2008 |

(Continued)

OTHER PUBLICATIONS

International Search Report, PCT/JP2012/074891, Nov. 15, 2012, 2 pp.

*Primary Examiner* — Wen-Ying P Chen
(74) *Attorney, Agent, or Firm* — Volpe and Koenig, P.C.

(57) ABSTRACT

A display device includes: a substrate; electrode terminals for external connection; an insulating film on the respective electrode terminals, the insulating film provided with openings which expose part of the respective electrode terminals, the insulating film covering the other portion of the respective electrode terminals; surface conductive films which are disposed so as to correspond to the respective openings, and are connected to part of the respective electrode terminals; and a circuit board disposed so as to oppose the substrate, the circuit board including circuit electrode terminals which are connected to the surface conductive films through a conductive bonding member so as to oppose the respective openings, the surface conductive films extending from an inside of an opening corresponding thereto to a surface of an insulating film corresponding thereto, peripheral edges of the respective surface conductive films being positioned beyond a peripheral edge of a circuit electrode terminal corresponding thereto.

6 Claims, 8 Drawing Sheets

(51) Int. Cl.
  *H05K 1/11* (2006.01)
  *G02F 1/1333* (2006.01)
  *H05K 1/18* (2006.01)
(52) U.S. Cl.
  CPC ....... *G02F 1/13452* (2013.01); *G02F 1/13454* (2013.01); *G02F 1/133345* (2013.01); *H05K 1/189* (2013.01); *H05K 2201/10136* (2013.01)

(56) References Cited

FOREIGN PATENT DOCUMENTS

| JP | 2009031362 A | 2/2009 |
| JP | 2009053579 A | 3/2009 |
| JP | 2010191200 A | 9/2010 |
| JP | 2011002583 A | 1/2011 |

* cited by examiner

DISPLAY DEVICE

TECHNICAL FIELD

The present invention relates to a display device for use in various apparatus such as a cellular phone, a digital camera, a portable game machine or a potable information terminal.

BACKGROUND ART

A display device includes a pair of substrates which are disposed so as to oppose each other, and a liquid crystal layer which is provided between the pair of substrates. A plurality of electrode terminals are provided on one substrate of the pair of substrates in a concentrated manner, and the plurality of electrode terminals are disposed in a given direction (for example, see Japanese Unexamined Patent Publication JP-A 2005-115129).

In addition, an insulating film having openings is formed on the plurality of electrode terminals, and a part of each electrode terminal is exposed from the openings. In addition, surface conductive films connected to the respective electrode terminals are provided in the respective openings, and the respective surface conductive films extend from the respective openings to the surface of the insulating film. Further, circuit electrode terminals of a circuit board such as a flexible substrate are connected to the respective surface conductive films positioned in the respective openings, through conductive bonding members.

However, in such a display device, since a peripheral edge of each surface conductive film is positioned inside with respect to a peripheral edge of each circuit electrode terminal which opposes thereto, an outer peripheral portion of the circuit electrode terminal does not oppose the surface conductive film. Accordingly, from this part, moisture or the like contained in the atmosphere is easily entered, the electrode terminals absorb the moisture or the like, and the electrode terminals may be corroded.

In recent years, in the display device, high display quality is required, and high definition is required for improving the display quality. Since the number of electrode terminals to be formed is increased for realizing the high definition, it is necessary to dispose the plurality of electrode terminals in high density. Accordingly, materials having low resistivity are employed for the electrode terminals, and the electrode terminals are formed to have a small size, and therefore, the plurality of electrode terminals are disposed in high density. On the other hand, since the materials generally tend to have low corrosion resistance, when the electrode terminals absorb moisture or the like contained in the atmosphere as described above, the electrode terminals may likely be corroded. In addition, the occurrence of the corrosion is more significant under the environment with a high temperature and high humidity.

When there is a progression of the corrosion of the electrode terminals, the electrode terminals and the circuit electrode terminals are disconnected from each other in some cases, and there was a problem of possibility of decrease in connection reliability with the circuit board.

Herein, the invention has been made to address the aforementioned problems, and an object thereof is to reduce the corrosion of the electrode terminals and to suppress the decrease in the connection reliability with the circuit board.

SUMMARY OF THE INVENTION

The invention provides a display device including: a substrate including a display region and a non-display region on a main surface thereof; a plurality of electrode terminals for external connection which are disposed in the non-display region on the main surface along one side of the substrate; an insulating film positioned on the respective plurality of electrode terminals, the insulating film provided with a plurality of openings which expose part of the respective plurality of electrode terminals, the insulating film covering the other portion of the respective plurality of electrode terminals; a plurality of surface conductive films which are disposed so as to correspond to the respective plurality of openings, and are connected to part of the respective plurality of electrode terminals; and a circuit board disposed so as to oppose the substrate, the circuit board including a plurality of circuit electrode terminals which are connected to the plurality of surface conductive films through a conductive bonding member so as to oppose the respective plurality of openings, the respective plurality of surface conductive films extending from an inside of an opening corresponding thereto to a surface of an insulating film corresponding thereto, peripheral edges of the respective plurality of surface conductive films being positioned beyond a peripheral edge of a circuit electrode terminal corresponding thereto.

DESCRIPTION OF EMBODIMENTS

[First Embodiment]

A display device 1 according to a first embodiment of the invention is described with reference to FIGS. 1 to 7.

Figure 1:
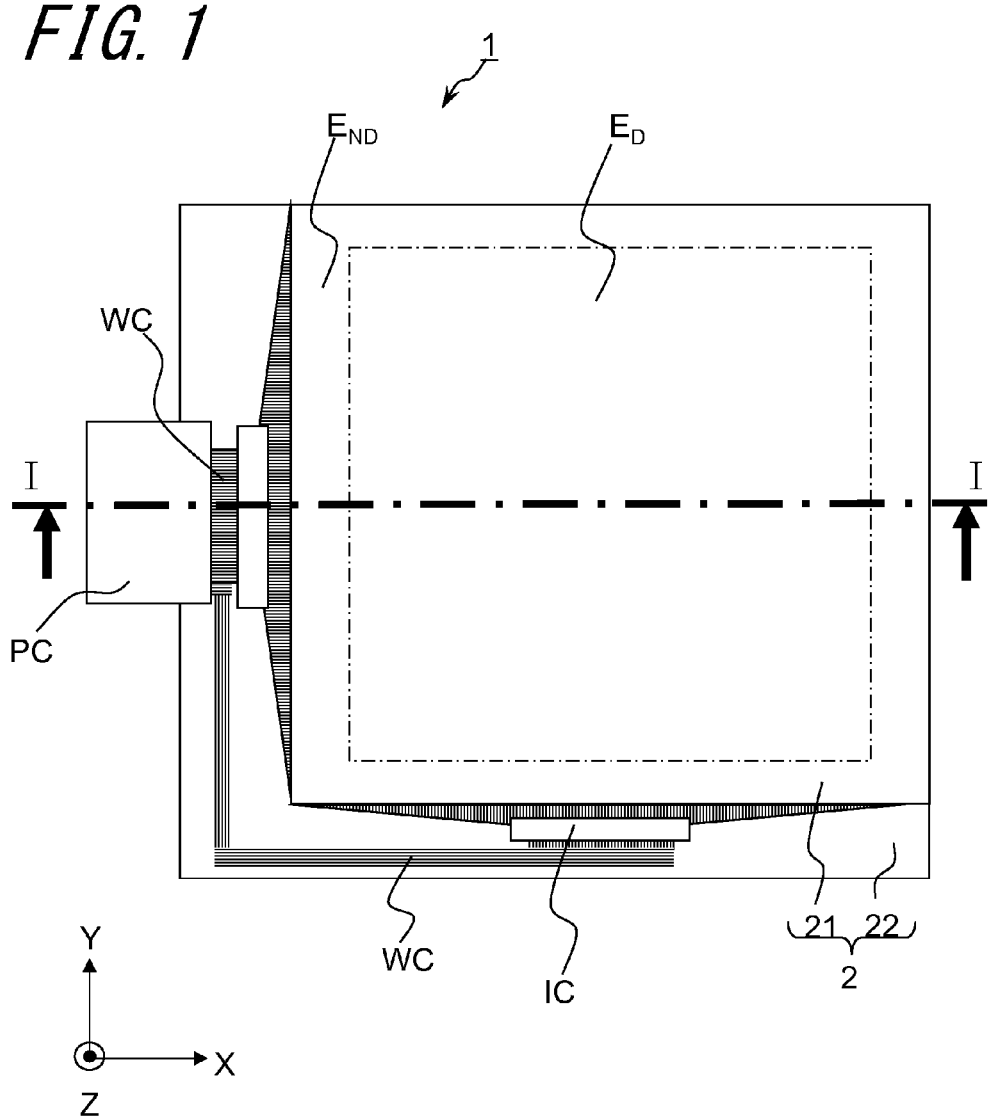
FIG. 1 is a plan view illustrating a display device according to a first embodiment of the invention.
Figure 2:
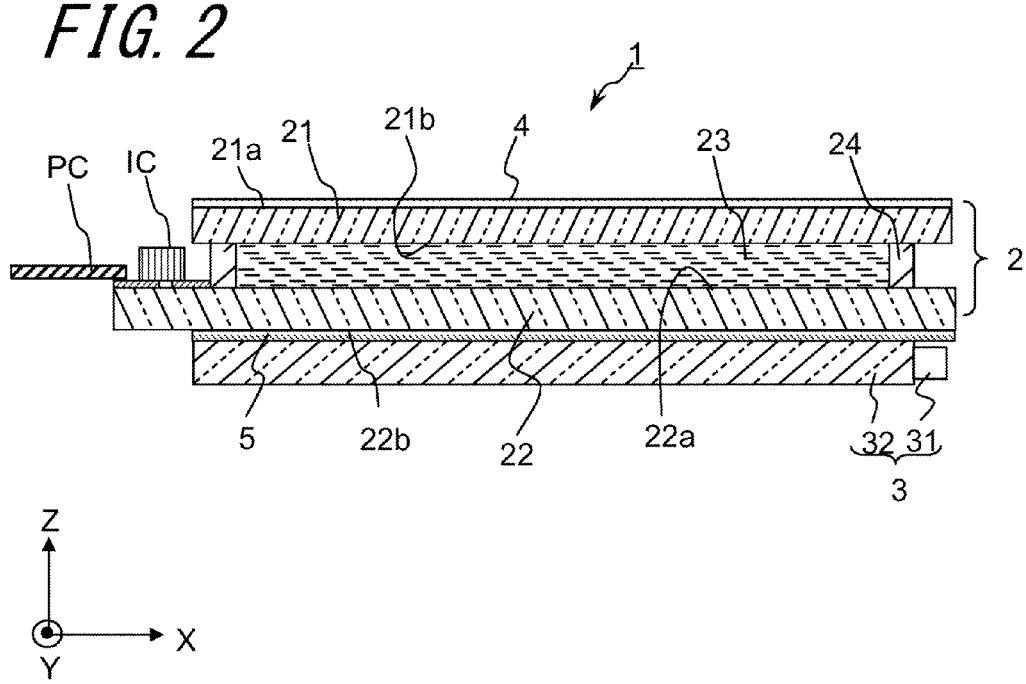
FIG. 2 is a cross-sectional view taken along the line I-I in FIG. 1.

As shown in FIG. 1 and FIG. 2, the display device 1 includes a display panel 2, a circuit board PC which is electrically connected to the display panel 2, a light source device 3 which emits light toward the display panel 2, a first polarizing plate 4 which is disposed on the display panel 2, and a second polarizing plate 5 which is disposed between the display panel 2 and the light source device 3.

In the display panel 2, a first substrate 21 and a second substrate 22 are disposed so as to oppose each other, a liquid crystal layer 23 is disposed between the first substrate 21 and the second substrate 22, and a sealing material 24 which bonds the first substrate 21 and the second substrate 22 is disposed so as to surround the liquid crystal layer 23. In addition, the circuit board PC is electrically connected to the second substrate 22 through a conductive bonding member BO.

The first substrate 21 has a first main surface 21a which is used as a display surface when displaying an image, and a second main surface 21b which is positioned on an opposite side to the first main surface 21a. The first substrate 21 is formed of a material having transmittance, for example, such as glass or plastic.

A light shielding film, color filters, a common electrode, and the like are disposed on the second main surface 21b of the first substrate 21.

The light shielding film is disposed on the second main surface 21b of the first substrate 21 in a lattice shape along an outer periphery of each pixel. As a material of the light shielding film, a resin to which a dye or a pigment with a color having a high light shielding property (for example, black) is added, or metal such as chromium or chromic oxide is used. In addition, the light shielding film is not limited to the case where it is disposed on the second main surface 21b in a lattice shape.

The color filters have a function of transmitting only a specified wavelength among visible light. The plurality of color filters are positioned on the second main surface 21b of the first substrate 21, and are disposed for each pixel. Each color filter has any color of red (R), green (G), and blue (B). In addition, the colors of the color filters are not limited to the colors described above, and may be yellow (Y) or white (W), for example. As a material of the color filters, a resin to which a dye or a pigment is added is used, for example.

The second substrate 22 includes a first main surface 22a which opposes the second main surface 21b of the first substrate 21, and a second main surface 22b which is positioned on a side opposite to the first main surface 22a. The second substrate 22 is formed of the same materials as the first substrate 21.

Figure 3:
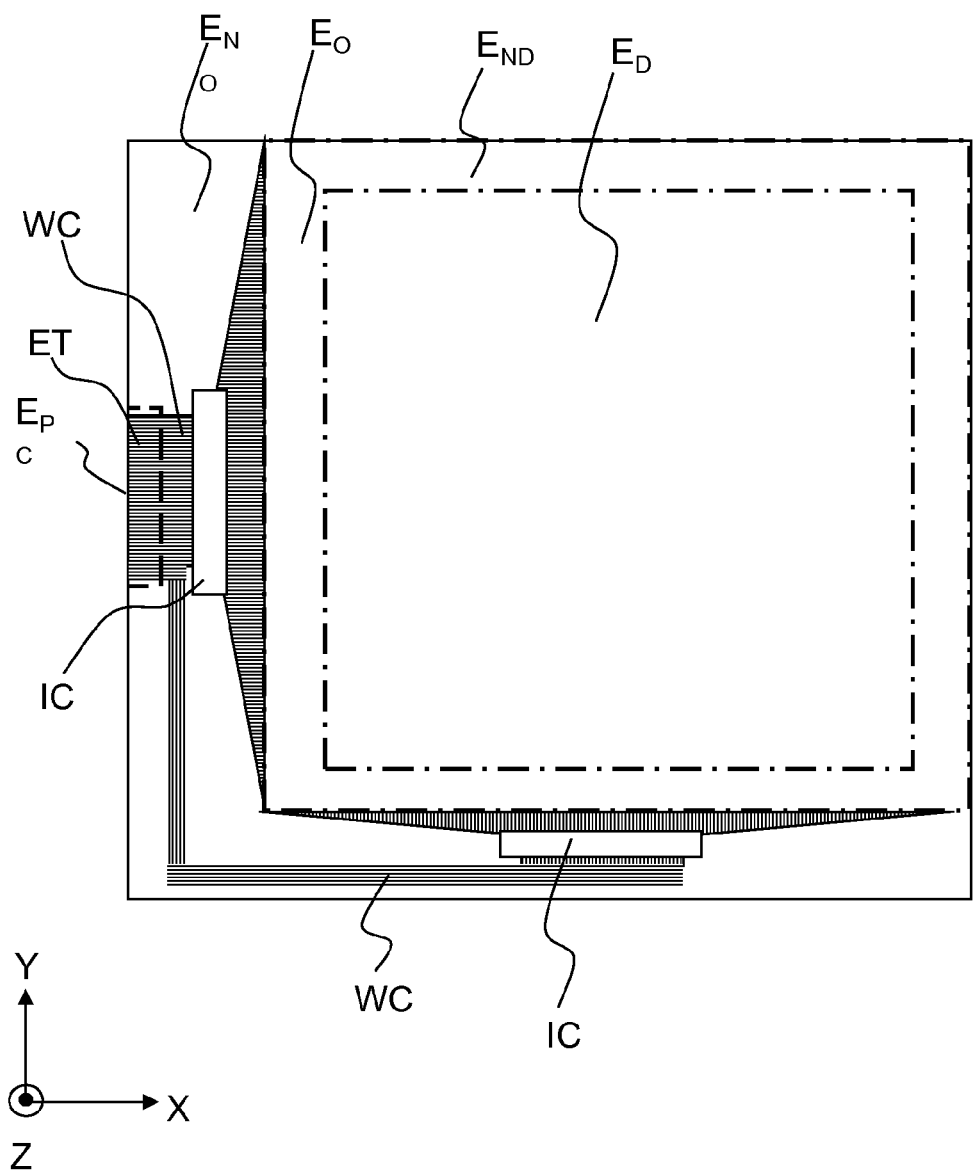
FIG. 3 is a plan view showing electrodes, wirings, and drivers on a second substrate.

As shown in FIG. 3, the second substrate 22 includes a display region $E_D$ for displaying an image, and a non-display region $E_{ND}$ which is positioned outside the display region $E_D$. In addition, the second substrate 22 includes an overlapping region $E_O$ which is overlapped with the first substrate 21, and a non-overlapping region $E_{NO}$ which is not overlapped with the first substrate 21. The overlapping region $E_O$ includes a part of the non-display region $E_{ND}$ and the display region $E_D$. The non-overlapping region $E_{NO}$ is positioned to be adjacent to the overlapping region $E_O$, and is continuously disposed along two sides of the first substrate 21. In addition, the non-overlapping region $E_{NO}$ may be disposed along one side of the first substrate 21, or may be continuously disposed along two or more sides (for example, three sides).

In addition, the non-overlapping region $E_{NO}$ of the second substrate 22 includes a part of the non-display region $E_{ND}$ and a connection region $E_{PC}$ for connection with the circuit board PC. Further, the connection region $E_{PC}$ is a region in which the circuit board PC opposes the second substrate 22.

Gate wirings, a gate insulating film, source wirings, thin-film transistors, signal electrodes, and the like are disposed on the first main surface 22a of the second substrate 22 in the display region $E_D$.

A plurality of the gate wirings which are disposed along a given direction, and a plurality of the source wirings which intersect with the respective gate wirings and are disposed along a direction perpendicular to the arrangement direction of the gate wirings, are disposed on the first main surface 22a of the second substrate 22. In addition, pixels are regions surrounded by the plurality of gate wirings and the plurality of source wirings.

In addition, a plurality of the thin-film transistors are positioned on the respective gate wirings through the gate insulating film. The source wirings are connected to a plurality of signal electrodes through the thin-film transistors, respectively. The respective signal electrodes are disposed in the respective pixels.

When voltage is applied to one of gate wirings, resistance of a semiconductor layer of the thin-film transistor positioned above the gate wiring is changed, and current flows to the thin-film transistor (ON state). When the thin-film transistor is in the ON state and an image signal is applied to the source wiring, writing of the image signal from the source wiring to the signal electrode through the thin-film transistor is performed, an electrical field is generated between the signal electrode and the common electrode based on the image signal, and the arrangement direction of the liquid crystal molecules positioned in the pixel is controlled.

In the display panel 2, a vertical electric field type is employed which controls the direction of the liquid crystal molecules in the liquid crystal layer 23 by the electric field generated between the common electrode disposed on the first substrate 21 and the signal electrode disposed on the second substrate 22, however, it is not limited thereto. That is, a horizontal electric field type may be employed which generates an electric field between the common electrode and the signal electrode which are disposed on the second substrate 22 side.

A wiring conductor WC, an electrode terminal ET, a surface conductive film CF, an insulating film IF, and a driver IC are disposed on the first main surface 22a of the second substrate 22 in the non-overlapping region $E_{NO}$. In the connection region $E_{PC}$, the second substrate 22 is connected to the circuit board PC through the conductive bonding member BO. In addition, the second substrate 22 is also connected to the driver IC through the conductive bonding member BO.

The wiring conductor WC is provided on the first main surface 22a of the second substrate 22. The wiring conductor WC is a wiring to which voltage for driving the display panel 2 is applied, and is, for example, connected to the driver IC and the like. The wiring conductor WC is formed of conductive materials, such as aluminum, molybdenum, titanium, neodymium, chromium, copper, or alloy containing them. In addition, the wiring conductor WC may not be a single-layered wiring, and may be a multi-layered wiring obtained by laminating those conductive materials.

The electrode terminal ET is a terminal for external connection for connecting the wiring conductor WC to the circuit board PC. The electrode terminal ET is formed on one end side of the wiring conductor WC which extends from the driver IC to the connection region $E_{PC}$. In addition, the plurality of electrode terminals ET are disposed in the connection region $E_{PC}$. That is, the plurality of electrode terminals ET are disposed in the connection region $E_{PC}$ in a concentrated manner. In the embodiment, the plurality of electrode terminals ET are disposed in one connection region $E_{PC}$ in a concentrated manner, however, it is not limited thereto. That is, the plurality of electrode terminals ET may be disposed in a concentrated manner in each connection region $E_{PC}$ by providing the plurality of connection regions $E_{PC}$.

Figure 4:
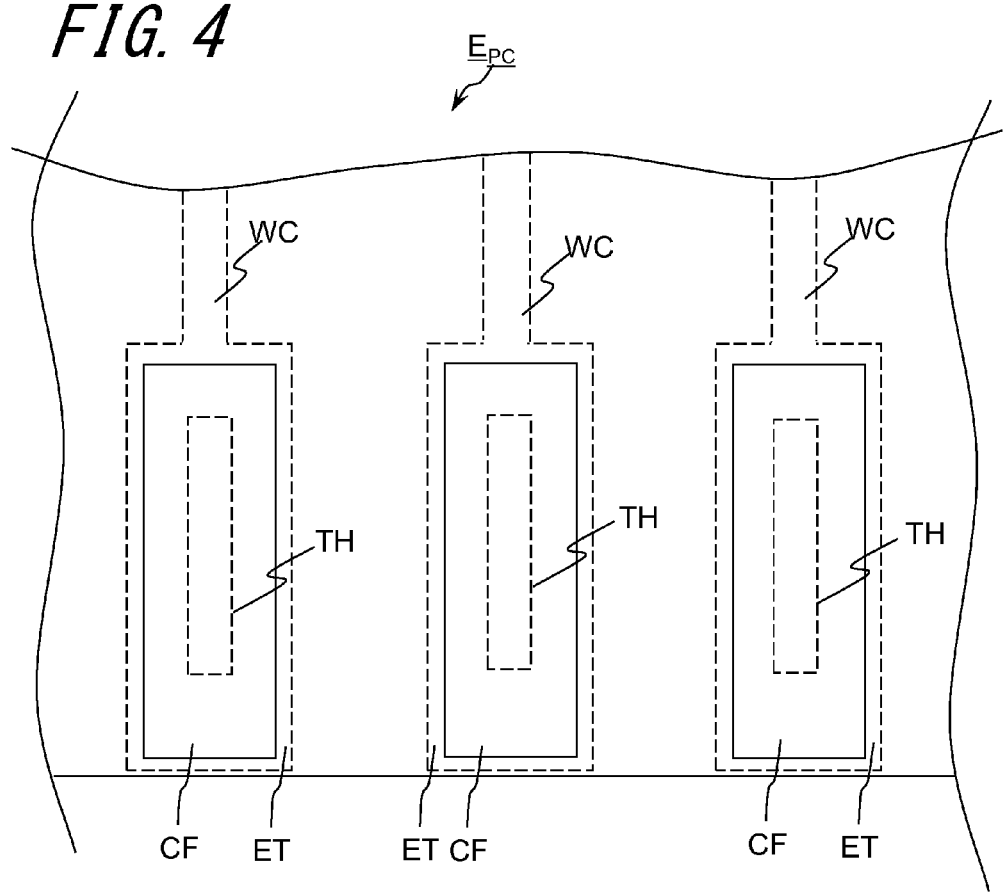
FIG. 4 is a plan view showing electrode terminals and the like positioned in a connection region.

As shown in FIG. 3 and FIG. 4, the plurality of electrode terminals ET are disposed along one side of the second substrate 22. That is to say, the plurality of electrode terminals ET are disposed along a given direction (Y direction). In addition, in a cross section taken along the arrangement direction of the electrode terminals ET (Y direction), a width $W_{ET}$ of the electrode terminal ET is set in a range of 60 μm to 200 μm, for example.

The electrode terminals ET are formed of conductive materials and may be formed of the same materials as the wiring conductor WC. In addition, the electrode terminals ET may not be a single-layered electrode, and may be a multi-layered electrode obtained by laminating the conductive materials.

The insulating film IF includes an opening TH, and is disposed on the first main surface 22a of the second substrate 22 so as to expose a part of the electrode terminal ET from the opening TH and cover the other part of the electrode terminal ET. Each opening TH of the insulating film IF is positioned on each electrode terminal ET. In addition, in a cross section taken along the arrangement direction of the electrode terminals ET (Y direction), a width $W_{TH}$ of the opening TH is set in a range of 10 μm to 80 μm, for example. Further, the width $W_{TH}$ of the opening TH is set to be smaller than a width $W_{CET}$ of a circuit electrode terminal CET of the circuit board PC.

Figure 6:
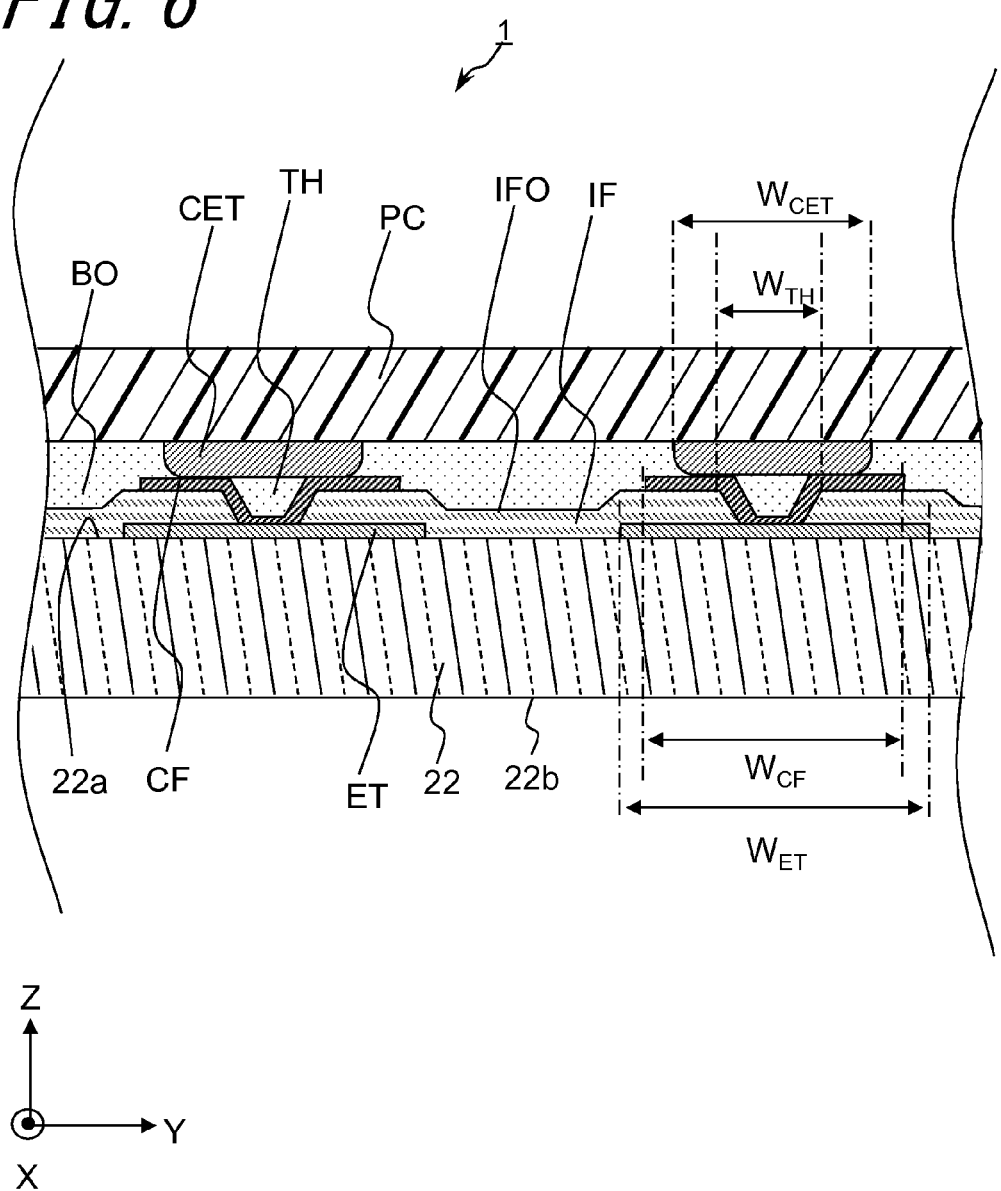
FIG. 6 is a cross-sectional view showing connection of the electrode terminals and the circuit electrode terminals in a cross section taken along the line II-II of FIG. 5.

As shown in FIG. 6, in a region between the adjacent openings TH, the insulating film IF is formed into a recess IFO which is depressed to the second substrate 22 side. Since the contacting area of the insulating film IF and the conductive bonding member BO is increased as the insulating film IF includes the recess IFO, bonding strength of the second substrate 22 and the circuit board PC is increased.

The insulating film IF is formed of materials having an insulating property, and an inorganic material such as silicon nitride or silicon oxide or an organic material is used, for example. In addition, the insulating film IF may not be a single-layered film, and may be a film obtained by laminating a plurality of layers.

In addition, the insulating film IF of the embodiment includes one opening TH for each electrode terminal ET, however, it is not limited thereto, and the insulating film may include the plurality of openings TH for each electrode terminal ET.

The surface conductive film CF is disposed on the electrode terminal ET positioned in each opening TH of the insulating film IF, and a part of the surface conductive film CF is positioned on the surface of the insulating film IF.

As shown in FIG. 6, in a cross section taken along the arrangement direction of the electrode terminals ET (Y direction), a width $W_{CF}$ of the surface conductive film CF is set to be greater than the width $W_{TH}$ of the opening TH of the insulating film IF. The width $W_{CF}$ of the surface conductive film CF is set in a range of 60 μm to 200 μm, for example.

The surface conductive film CF is formed of the conductive materials, and is formed of a conductive oxide film such as ITO (Indium Tin Oxide) or IZO (Indium Zinc Oxide), for example.

In addition, as shown in FIG. 6, a surface conductive film CF does not extend to the recess IFO positioned between the openings TH adjacent to each other in the Y direction. When the surface conductive film CF is positioned in the recess IFO, the adjacent surface conductive films CF are close to each other, and the adjacent surface conductive films CF are likely to be conducted to each other through particles contained in the conductive bonding member BO. Accordingly, by not providing the surface conductive film CF in the recess IFO, the adjacent surface conductive films CF are separated from each other, and it is possible to suppress the conduction of the adjacent surface conductive films CF.

The driver IC has a function of controlling driving of the gate wirings and the source wirings. The driver IC is positioned on the second main surface 22a of the second substrate 22 in the non-overlapping region $E_{NO}$. The driver IC is provided along the side of the first substrate 21, however, it is not limited thereto. The driver IC is connected to the plurality of wiring conductors WC through the conductive bonding member BO.

The circuit board PC is connected to the second substrate 22 through the conductive bonding member BO. A part of the circuit board PC opposes the second substrate 22.

The circuit board PC includes a base, a wiring pattern, and the circuit electrode terminal CET. The base has a function of supporting the wiring pattern and the circuit electrode terminal CET. The base is formed of materials having an insulating property, and for example, a resin is used. In addition, when the base is formed of materials having flexibility such as a polyimide resin, since it is possible to flexibly fold the circuit board PC, in a case of mounting the display device 1 on an electronic device or the like, it is possible to mount the display device 1 in a more compact manner.

The circuit electrode terminal CET is electrically connected to the surface conductive film CF through the conductive bonding member BO so as to oppose each opening TH. The circuit electrode terminal CET is formed of materials having conductivity, and is formed of copper, for example. In addition, the width $W_{CET}$ of the circuit electrode terminal CET is set in a range of 50 μm to 150 μm, for example.

When connecting the second substrate 22 and the circuit board PC to each other, the conductive bonding member BO is disposed in the connection region $E_{PC}$ of the second substrate 22, positioning is performed so that each opening TH (electrode terminal ET) of the insulating film IF positioned in the connection region $E_{PC}$ and each circuit electrode terminal CET of the circuit board PC oppose each other, the circuit board PC is disposed on the connection region $E_{PC}$ of the second substrate 22, and thermocompression bonding of the second substrate 22 and the circuit board PC is performed, and thus, the second substrate 22 and the circuit board PC are connected to each other through the conductive bonding member BO.

Herein, when connecting the second substrate 22 and the circuit board PC to each other, when deviation occurs in the positional relationship between the opening TH (electrode terminal ET) and the circuit electrode terminal CET due to the variation of positioning precision, the opening TH of the insulating film IF is exposed from the circuit electrode terminal CET due to this position deviation, and the electrode terminal ET positioned in the opening TH may be corroded.

With respect to this, in the display device 1, in a cross section taken along the arrangement direction of the electrode terminals ET (Y direction), one end and the other end of the surface conductive film CF extend from the upper portion of the electrode terminal ET in the opening TH to the surface of the insulating film IF. Accordingly, when connecting the second substrate 22 and the circuit board PC to each other, even in a case where the position deviation occurs in the Y direction and the opening TH of the insulating film IF is exposed from the circuit electrode terminal CET, since the electrode terminal ET in the opening TH is covered with the surface conductive film CF in the Y direction, corrosion of the electrode terminal ET due to the moisture absorption of the electrode terminal ET can be reduced.

In addition, even in a cross section taken along a direction perpendicular to the arrangement direction of the electrode terminals ET (X direction), one end and the other end of the surface conductive film CF extend from the upper portion of the electrode terminal ET in the opening TH to the surface of the insulating film IF. Accordingly, when connecting the second substrate 22 and the circuit board PC to each other, even in a case where the position deviation occurs in the X direction and the opening TH of the insulating film IF is exposed from the circuit electrode terminal CET, since the electrode terminal ET in the opening TH is covered with the surface conductive film CF in the X direction, corrosion of the electrode terminal ET due to the moisture absorption of the electrode terminal ET can be reduced.

Figure 5:
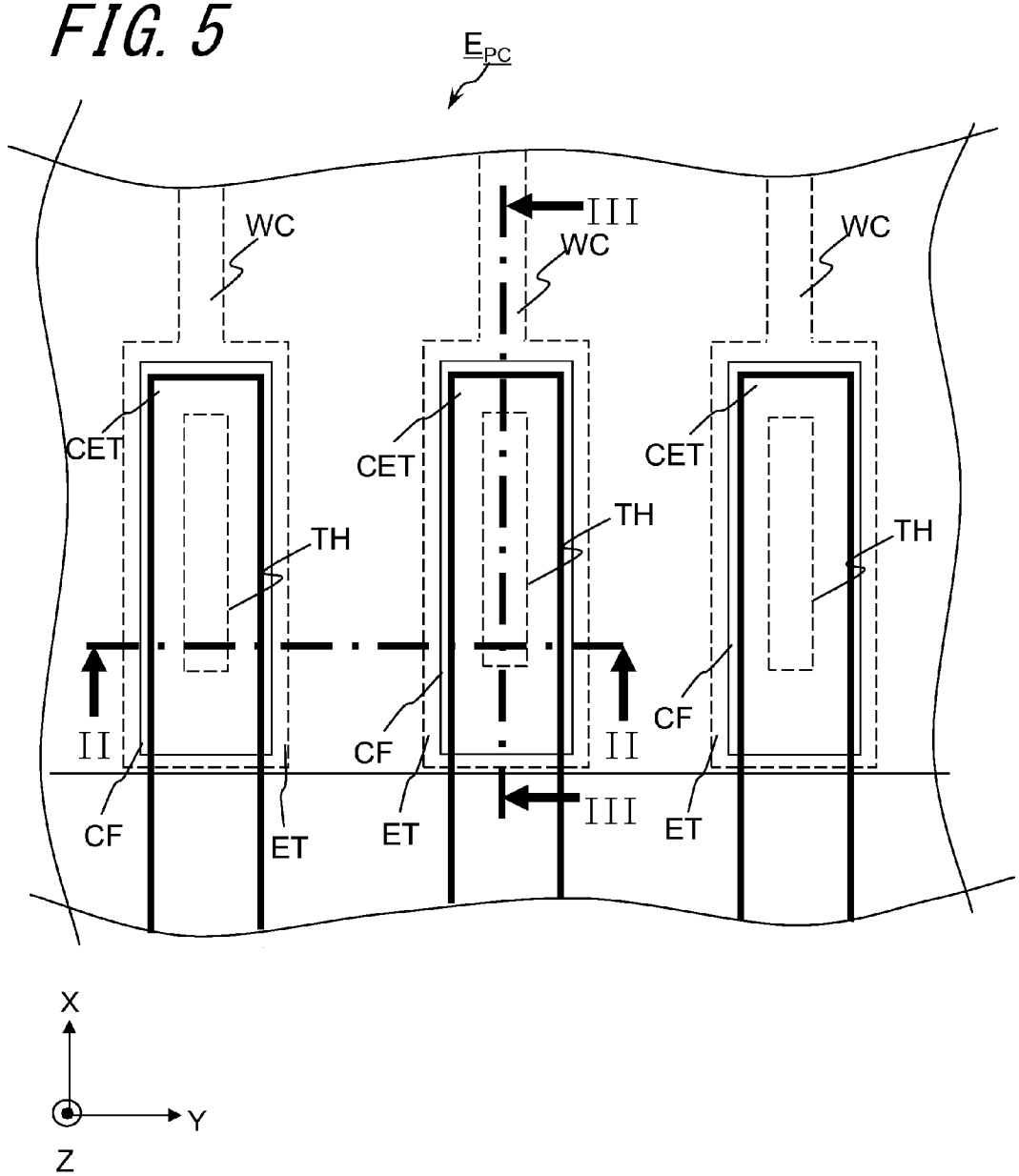
FIG. 5 is a plan view obtained by adding circuit electrode terminals to FIG. 4.

In the display device 1, as shown in FIG. 5, peripheral edges of the respective surface conductive films CF are positioned beyond a peripheral edge of a circuit electrode terminal CET corresponding thereto. That is, the outer peripheral portion of the circuit electrode terminal CF opposes the surface conductive film CET. Thus, it is possible to reduce generation of gaps in the outer peripheral portion of the circuit electrode terminal CF, to suppress infiltration of moisture or the like contained in the atmosphere from that part, and to reduce corrosion of the electrode terminal ET.

In the display device 1, as shown in FIG. 6, in a cross section taken along the arrangement direction of the electrode terminals ET (Y direction), the width $W_{CET}$ of the circuit electrode terminal CET is set to be small compared to the width $W_{CF}$ of the surface conductive film CF, and both ends of the circuit electrode terminal CET are positioned within both ends of the surface conductive film CF. Thus, it is possible to reduce generation of gaps in the outer peripheral portion of the circuit electrode terminal CF in the Y direction, to suppress infiltration of moisture or the like contained in the atmosphere from that part, and to reduce corrosion of the electrode terminal ET.

Additionally, when connecting the second substrate 22 and the circuit board PC to each other, even if the position deviation occurs in Y direction between the electrode terminal ET positioned in the opening TH and the circuit electrode terminal CET, since both ends of the surface conductive film CF are positioned beyond both ends of the circuit electrode terminal CET, it is possible to secure the connection area between the circuit electrode terminal CET and the surface conductive film CF, and to reduce connection failure between the electrode terminal ET and the circuit electrode terminal CET.

Figure 7:
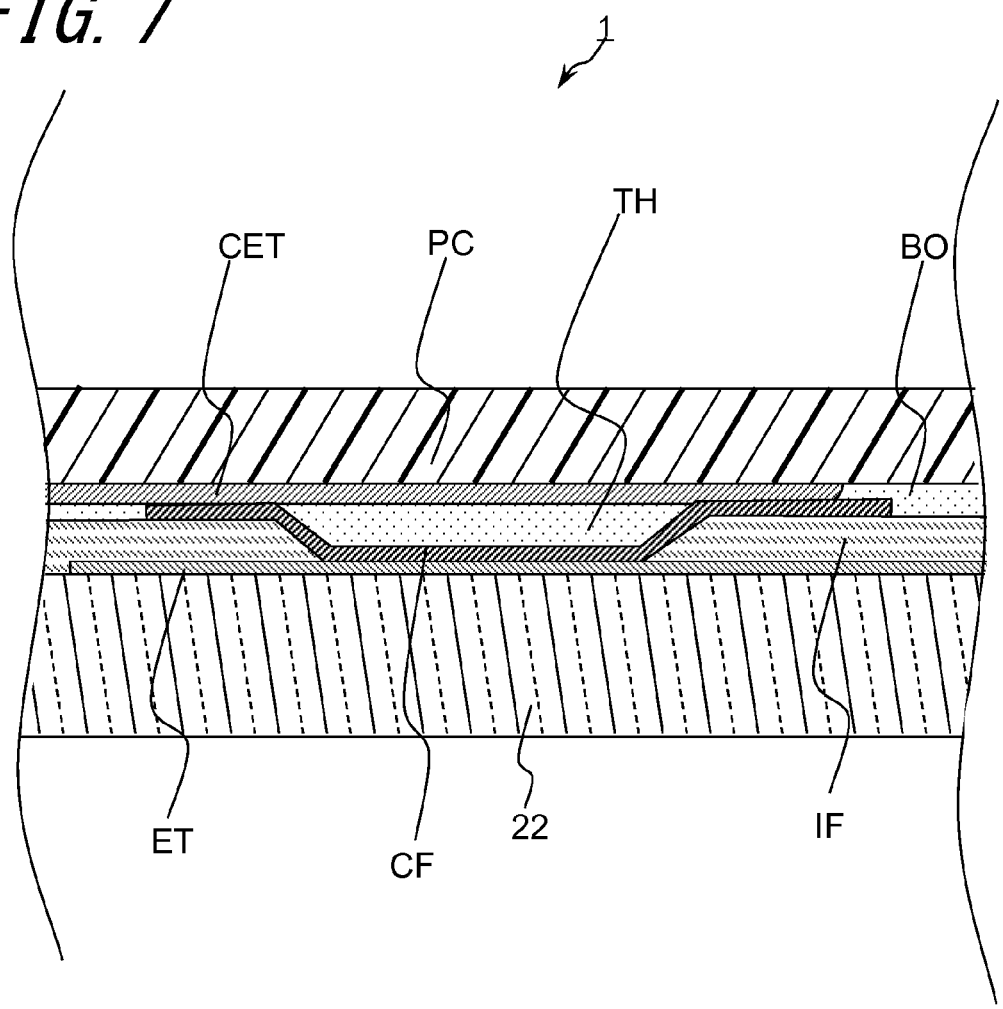
FIG. 7 is a cross-sectional view showing connection of the electrode terminals and the circuit electrode terminals in a cross section taken along the line III-III of FIG. 5.

As shown in FIG. 7, in a cross section taken along a direction perpendicular to the arrangement direction of the electrode terminals (X direction), the surface conductive film CF extends beyond one end of the circuit electrode terminal CET on the wiring conductor WC side. Thus, it is possible to reduce generation of gaps in the outer peripheral portion of the circuit electrode terminal CET on one end side of the wiring conductor WC side, to suppress infiltration of moisture or the like contained in the atmosphere from that part, and to reduce corrosion of the electrode terminal ET.

Additionally, when connecting the second substrate 22 and the circuit substrate PC to each other, even if the position deviation occurs between the electrode terminal ET positioned in the opening TH and the circuit electrode terminal CET to the wiring conductor WC side in the X direction, since one end of the surface conductive film CF is positioned beyond one end of the circuit electrode terminal CET, it is possible to secure the connection area between the circuit electrode terminal CET and the surface conductive film CF, and to reduce connection failure between the electrode terminal ET and the circuit electrode terminal CET.

In addition, as shown in FIG. 5 and FIG. 6, in the Y direction, the width $W_{ET}$ of the electrode terminal ET is set to be equal to or greater than the width $W_{CF}$ of the surface conductive film CF, and both ends of the electrode terminal ET are positioned beyond both ends of the surface conductive film CF. Herein, when the width $W_{ET}$ of the electrode terminal ET is smaller than the width $W_{CF}$ of the surface conductive film CF, the surface conductive film CF is influenced by the level difference of the electrode terminal ET and the first main surface 22a of the second substrate 22, and flatness of the surface conductive film CF is easily degraded. Accordingly, by setting the width $W_{ET}$ of the electrode terminal ET to be equal to or greater than the width $W_{CF}$ of the surface conductive film CF, and providing the surface conductive film CF in the formation region of the electrode terminal ET, it is possible to suppress the degradation of the flatness of the surface conductive film CF. In addition, in the embodiment, both ends of the electrode terminal ET are positioned beyond both ends of the surface conductive film CF, however, it is not limited thereto, and both ends of the electrode terminal ET may be overlapped with both ends of the surface conductive film CF.

In addition, as shown in FIG. 5 and FIG. 7, also in the X direction in the same manner as in the Y direction, the width of the electrode terminal ET is set to be equal to or greater than the width of the surface conductive film CF, and the surface conductive film CF is positioned in the formation region of the electrode terminal ET. Thus, it is possible to suppress the degradation of the flatness of the surface conductive film CF, in the same manner as described above.

The conducive bonding member BO has a function of electrically connecting the circuit board PC and the second substrate 22. The conductive bonding member BO is a bonding member having conductivity such as an anisotropic conductive film.

The liquid crystal layer 23 is disposed between the first substrate 21 and the second substrate 22. The liquid crystal layer 23 contains liquid crystal molecules such as a nematic liquid crystal.

The sealing material 24 has a function of adhering the first substrate 21 and the second substrate 22. The sealing material 24 is disposed between the first substrate 21 and the second substrate 22. This sealing material 24 is formed of an epoxy resin or the like.

The light source device 3 has a function of emitting light toward the display panel 2. The light source device 3 includes a light source 31 and a light guide plate 32. In addition, in the light source device 3 of the embodiment, a point light source such as an LED is employed as the light source 31, however, a line light source such as a cold-cathode fluorescent lamp may be employed.

The first polarizing plate 4 has a function of selectively transmitting light vibrating in a predetermined vibrating direction. This first polarizing plate 4 is disposed so as to oppose the first main surface 21a of the first substrate 21 in the display panel 2.

The second polarizing plate 5 has a function of selectively transmitting light vibrating in a predetermined vibrating direction. This second polarizing plate 5 is disposed so as to oppose the second main surface 22b of the second substrate 22.

[Second Embodiment]

Figure 8:
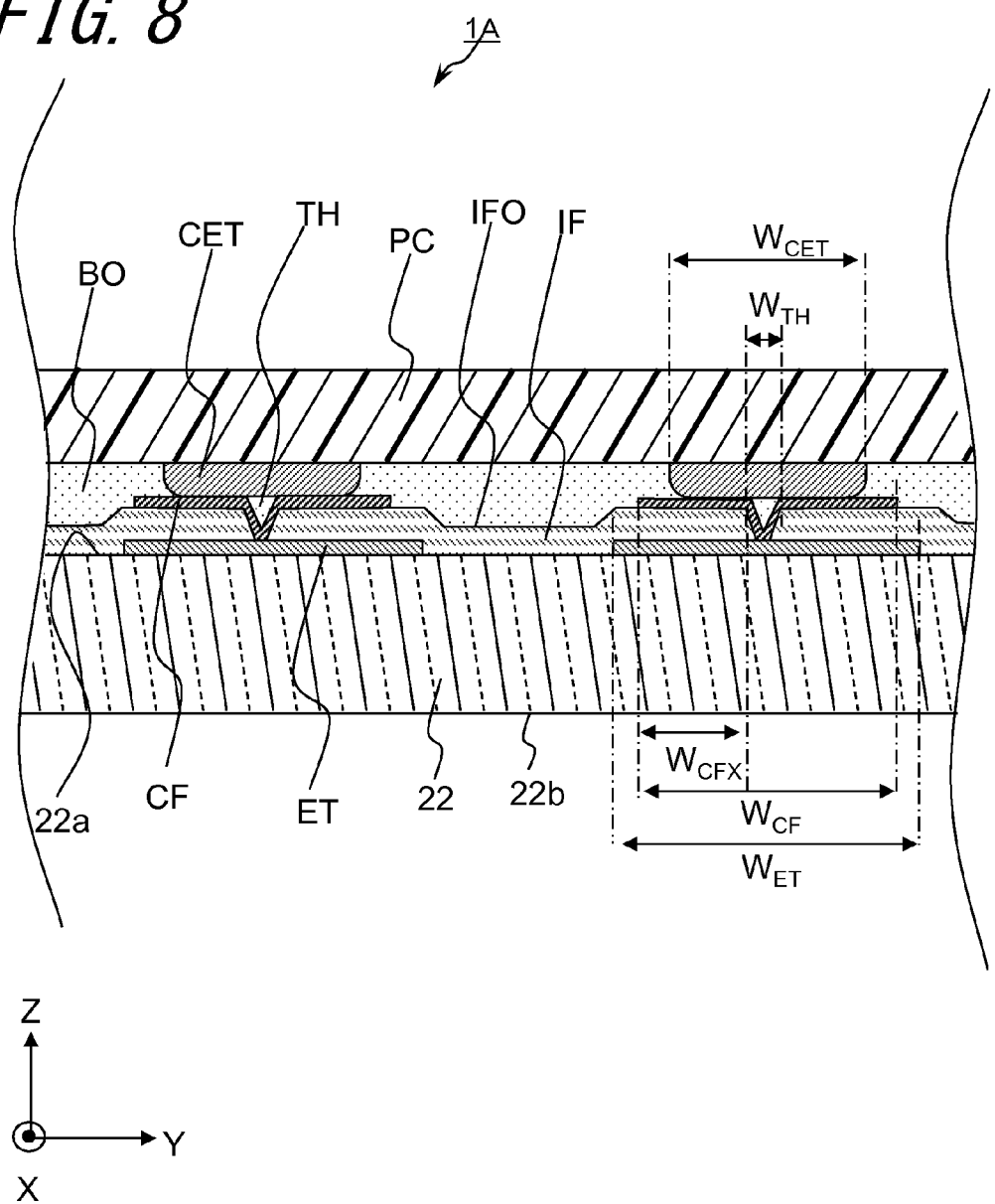
FIG. 8 is a cross-sectional view showing main parts of a display device according to a second embodiment of the invention.

FIG. 8 is a view showing main parts of a display device 1A according to a second embodiment. In detail, FIG. 8 is a cross-sectional view showing connection between the electrode terminal ET and the circuit electrode terminal CET of the display device 1A.

Compared to the display device 1, the display device 1A is different in that the width $W_{TH}$ of the opening TH of the insulating film IF is set to be smaller than the width $W_{CFX}$ of the surface conductive film CF positioned on the insulating film IF.

As shown in FIG. 8, the width $W_{CFX}$ of the surface conductive film CF on the insulating film IF denotes a width of the surface conductive film CF from one end of the surface conductive film CF to the end of the opening TH, in a cross section taken along the arrangement direction of the electrode terminals ET (Y direction).

In the case where the width $W_{TH}$ of the opening TH is small, when connecting the electrode terminal ET and the circuit electrode terminal CET to each other, even if the positioning deviation occurs between the electrode terminal ET positioned in the opening TH and the circuit electrode terminal CET in the Y direction, it is possible to reduce the exposed portion of the electrode terminal ET and to suppress the corrosion of the electrode terminal ET. On the other hand, when the width $W_{CFX}$ of the surface conductive film CF on the insulating film IF is secured, the contacting area of the surface conductive film CF and the circuit electrode terminal CET of the circuit board PC is secured. Therefore, even if the width $W_{TH}$ of the opening TH becomes small and the exposed area of the electrode terminal ET becomes small, the connection of the electrode terminal ET and the circuit electrode terminal CET of the circuit board PC is maintained in an excellent manner.

The invention is not particularly limited to the first and second embodiments, and various modifications or improvement can be performed in the scope of the invention.

In addition, the display panel 2 of the invention is not limited to the liquid crystal panel, and may be an organic EL display, an inorganic EL display, or the like.

REFERENCE SIGNS LIST 1, 1A: Display device
2: Display panel
$E_D$: Display region
$E_{ND}$: Non-display region
$E_O$: Overlapping region
$E_{NO}$: Non-overlapping region
$E_{PC}$: Connection region
21: First substrate
21a: First main surface
21b: Second main surface
22: Second substrate (Substrate)
22a: First main surface (Main surface)
22b: Second main surface
3: Light source device
31: Light source
32: Light guide plate
WC: Wiring conductor
ET: Electrode terminal
IF: Insulating film
IFO: Recess
TH: Opening
CF: Surface conductive film
PC: Circuit board
CET: Circuit electrode terminal
BO: Conductive bonding member

What is claimed is:

1. A display device comprising:
a substrate including a display region and a non-display region on a main surface thereof;
a plurality of electrode terminals are disposed in the non-display region on the main surface along one side of the substrate;
an insulating film positioned on the respective plurality of electrode terminals, the insulating film provided with a plurality of openings which expose part of the respective plurality of electrode terminals;
a plurality of surface conductive films which are disposed to correspond to the respective plurality of openings; and
a circuit board disposed to oppose the substrate, the circuit board including a plurality of circuit electrode terminals which are connected to the plurality of surface conductive films,
a peripheral edge of the plurality of surface conductive films being positioned beyond a peripheral edge of the plurality of circuit electrode terminals corresponding thereto,
wherein, when seen in a cross section taken along an arrangement direction of the plurality of electrode terminals, both ends of the surface conductive films are positioned beyond both ends of the circuit electrode terminals corresponding thereto, and
wherein, when seen in the cross section taken along the arrangement direction of the plurality of electrode terminals, widths of the respective plurality of electrode terminals are equal to or greater than a width of a surface conductive film corresponding thereto, and both ends of the respective plurality of electrode terminals are positioned beyond both ends of a surface conductive film corresponding thereto or to be overlapped with the both ends of the surface conductive film corresponding thereto.

2. The display device according to claim 1, wherein, when seen in the cross section taken along the arrangement direction of the plurality of electrode terminals, widths of the openings are smaller than a width of a circuit electrode terminal corresponding thereto.

3. The display device according to claim 1, wherein, when seen in a cross section taken along a direction perpendicular to an arrangement direction of the plurality of electrode terminals, the respective plurality of surface conductive films extend beyond an end of a circuit electrode terminal corresponding thereto on a side opposite to the one side of the substrate.

4. A display device comprising:
a substrate including a display region and a non-display region on a main surface thereof;
a plurality of electrode terminals are disposed in the non-display region on the main surface along one side of the substrate;
an insulating film positioned on the respective plurality of electrode terminals, the insulating film provided with a plurality of openings which expose part of the respective plurality of electrode terminals;
a plurality of surface conductive films which are disposed to correspond to the respective plurality of openings; and
a circuit board disposed to oppose the substrate, the circuit board including a plurality of circuit electrode terminals which are connected to the plurality of surface conductive films, a peripheral edge of the plurality of surface conductive films being positioned beyond a peripheral edge of the plurality of circuit electrode terminals corresponding thereto, wherein, when seen in a cross section taken along an arrangement direction of the plurality of electrode terminals, both ends of the surface conductive films are positioned beyond both ends of the circuit electrode terminals corresponding thereto, and wherein, when seen in the cross section taken along the arrangement direction of the plurality of electrode terminals, a recess is disposed between adjacent openings.

5. The display device according to claim 4, wherein, when seen in the cross section taken along the arrangement direction of the plurality of electrode terminals, the respective plurality of surface conductive films do not extend to the recess.

6. The display device according to claim 4, wherein, when seen in a cross section taken along a direction perpendicular to an arrangement direction of the plurality of electrode terminals, the respective plurality of surface conductive films extend beyond an end of a circuit electrode terminal corresponding thereto on a side opposite to the one side of the substrate.

* * * * *